(12) United States Patent
Choi et al.

(10) Patent No.: US 8,989,372 B2
(45) Date of Patent: Mar. 24, 2015

(54) COVER FOR MOBILE TERMINAL (71) Applicants: Myungsoo Choi, Seoul (KR); Jisun Yang, Seoul (KR); Minsoo Kim, Seoul (KR); Kyungtae Yang, Seoul (KR)

(72) Inventors: Myungsoo Choi, Seoul (KR); Jisun Yang, Seoul (KR); Minsoo Kim, Seoul (KR); Kyungtae Yang, Seoul (KR)

(73) Assignee: LG Electronics Inc., Seoul (KR)

(*) Notice: Subject to any disclaimer, the term of this patent is extended or adjusted under 35 U.S.C. 154(b) by 61 days.

(21) Appl. No.: 13/741,486

(22) Filed: Jan. 15, 2013

(65) Prior Publication Data

US 2014/0077669 A1    Mar. 20, 2014

(30) Foreign Application Priority Data

Sep. 18, 2012    (KR) .................. 10-2012-0103107

(51) Int. Cl.
*H04M 1/00*    (2006.01)
*H05K 5/00*    (2006.01)
*G06F 1/16*    (2006.01)
*H04M 1/04*    (2006.01)

(52) U.S. Cl.
CPC ............ *H05K 5/0004* (2013.01); *G06F 1/1626* (2013.01); *H04M 1/04* (2013.01); *G06F 2200/1632* (2013.01)
USPC ...................................... 379/447; 455/575.1

(58) Field of Classification Search
USPC ............. 379/428.01, 441, 447, 450; 345/156, 345/179; 455/556.1, 575.1; 361/679.01; 206/320
See application file for complete search history.

(56) References Cited

U.S. PATENT DOCUMENTS

| 2004/0173482 A1 | 9/2004 | Nieves |
| 2005/0225528 A1 | 10/2005 | Huang et al. |
| 2010/0159997 A1 | 6/2010 | Wang |
| 2011/0221710 A1 | 9/2011 | Liang |

FOREIGN PATENT DOCUMENTS

CN          102183994          9/2011

OTHER PUBLICATIONS

European Search Report issued in Appln No. 13155865.2 dated Jan. 3, 2014.

*Primary Examiner* — Tuan D Nguyen
(74) *Attorney, Agent, or Firm* — KED & Associates LLP (57) ABSTRACT A case for a mobile terminal is provided to which a stylus pen may be stably coupled. The case may include a mobile terminal receiving portion in which a mobile terminal is received, and a stylus pen receiving portion in which a stylus pen is received. The stylus pen may be coupled to a groove provided in the stylus pen receiving portion, at a portion of the case adjacent to the mobile terminal receiving portion at a back side of the mobile terminal, to store the stylus pen together with the mobile terminal.

21 Claims, 9 Drawing Sheets

COVER FOR MOBILE TERMINAL

CROSS-REFERENCE TO RELATED APPLICATION(S)

This application claims priority under 35 U.S.C. §119 to Korean Application No. 10-2012-0103107 filed on Sep. 18, 2012, whose entire disclosure is hereby incorporated by reference.

BACKGROUND

1. Field

This relates to a case for a mobile terminal.

2. Background

A mobile terminal may be configured to perform various functions, such as data and voice communications, capturing images and video via a camera, recording audio, playing music files and outputting music via a speaker system, and displaying images and video on a display. Some terminals may also support game playing, while other terminals may also be configured as multimedia players that receive broadcast and multicast signals. Terminals may be classified as mobile terminals or stationary terminals based on their degree (e.g., ease) of mobility. Mobile terminals may be further classified as handheld terminals or vehicle mount terminals based on a corresponding manner of portability.

BRIEF DESCRIPTION OF THE DRAWINGS

The embodiments will be described in detail with reference to the following drawings in which like reference numerals refer to like elements wherein.

DETAILED DESCRIPTION

In the following detailed description, reference is made to the accompanying drawing figures which form a part hereof, and which show by way of illustration various embodiments. It may be understood by those of ordinary skill in this technological field that other embodiments may be utilized, and structural, electrical, as well as procedural changes may be made without departing from the scope as broadly described herein. Wherever possible, the same reference numbers will be used throughout the drawings to refer to the same or similar parts.

As used herein, the suffixes 'module', 'unit' and 'part' may be used for elements simply to facilitate the disclosure. Therefore, significant meanings or roles are not given to the suffixes themselves and it is understood that 'module', 'unit' and 'part' may be used together or interchangeably.

Features of embodiments as broadly described herein may be are applicable to various types of terminals. Examples of such terminals may include mobile terminals, such as mobile phones, user equipment, smart phones, mobile computers, digital broadcast terminals, personal digital assistants, portable multimedia players (PMP) and navigation systems. However, simply for ease of discussion and illustration herein, further description will be provided with regard to a mobile terminal, noting that such teachings may apply equally to other types of terminals such as digital TV, desktop computers and other types of terminals as appropriate.

A mobile terminal may be operated, or functions of the mobile terminal may be implemented via, for example, a touchscreen. A user may position a finger or a stylus pen or a touch pen, or other appropriate touching or pointing implement, on such a mobile terminal to implement the functions. When using an auxiliary stylus pen, compared with when using a touch pen, more delicate implementation may be achieved and contamination generated on the touchscreen by a fingerprint and the like may be prevented. Such a stylus pen may be provided as an auxiliary accessory or may be embedded in a mobile terminal for storage when not in use.

However, it may be inconvenient to carry such a separate stylus pen when provided as an accessory item, and such a separate stylus pen may be misplaced. An accessory case having a structure for storing a separate stylus pen may be provided. Even in this instance, the stylus pen may not always be stably stored and the stylus pen may still be misplaced.

Moreover, if an embedded type stylus pen is provided in a mobile terminal, a predetermined space occupied by the stylus pen may detract from space which could be occupied by other components, and it may be difficult to realize a slim design mobile terminal. Even when the embedded type stylus pen is provided, a mounting structure may not be sufficiently secure, and there may still be concern of stylus pen loss.

Figure 1:
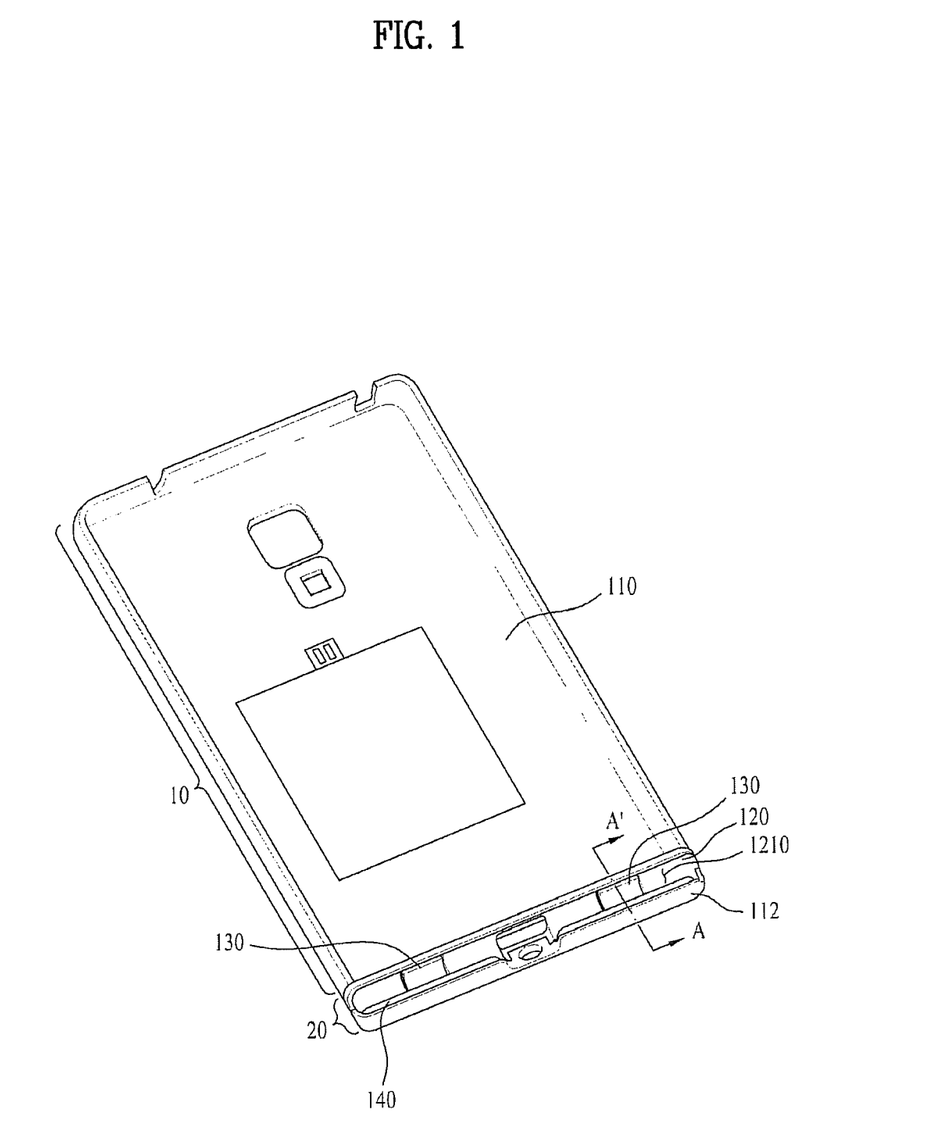
FIG. 1 is a perspective view of a case for a mobile terminal according to one embodiment as broadly described herein.
Figure 2:
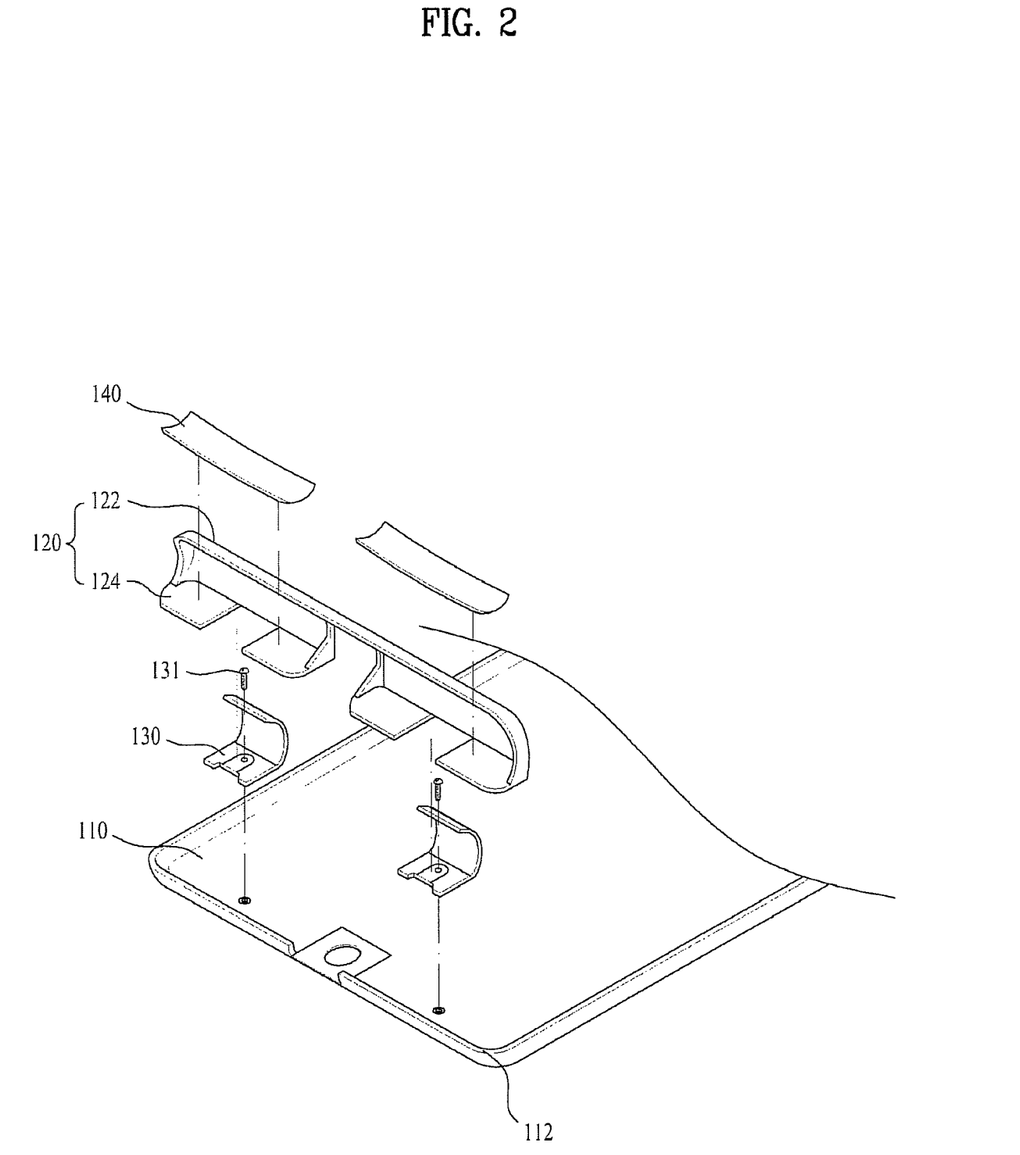
FIG. 2 is an exploded perspective view of a rear mounting case, a seating member and a bending hook of the case for the mobile terminal shown in FIG. 1.

As shown in FIGS. 1 and 2, a case for a mobile terminal (hereinafter, the mobile terminal case) according to one embodiment may include a rear mounting case 110, a seating member 120, or seating bracket 120, and one or more bending hooks 130.

The rear mounting case 110 may include a recessed portion that defines a mobile terminal accommodating portion 10, or terminal receiving recess 10, having a shape corresponding to the back surface of the mobile terminal. Thus, the mobile terminal may be seated on the mobile terminal accommodating portion 10 to couple the rear mounting case 110 to the mobile terminal.

As shown in FIGS. 1 and 2, the seating member 120 may be coupled to an edge portion of the rear mounting case 110 to form a stylus pen accommodating groove 1210. In this instance, a corresponding edge of the rear mounting case 110 may project outward beyond the edge of the mobile terminal accommodated in the rear mounting case 110.

In a mobile terminal including an external battery pack, the rear mounting case 110 may be directly coupled to a rear case of the mobile terminal instead of a battery cover to cover the external battery pack received in a back surface of the rear case itself. In another embodiment, the rear mounting case 110 may be coupled to a back surface of a battery cover, which is coupled to a back surface of the rear case, to cover the external battery pack received in the back surface of the rear case. In a mobile terminal including an internal battery pack, the rear mounting case 110 may be coupled to a back surface of a rear case defining an exterior appearance of the mobile terminal.

As shown in FIGS. 1 and 2, the seating member 120 may extend along an edge of the rear mounting case 110 to form the stylus pen accommodating groove 1210, or stylus groove 1210. The stylus pen accommodating groove 1210 formed by the seating member 120 may be arranged on the rear mounting case 110 along an end of the rear mounting case 110. For example, the stylus pen accommodating groove 1210 may extend along at a lower end portion of the rear mounting case 110, corresponding to a lower edge of the mobile terminal to be received in the mobile terminal accommodating portion 10. Alternatively, the stylus pen accommodating groove 1210 may be formed at an upper, right or left end portion of the rear mounting case 110. The stylus pen accommodating groove 1210 may define a stylus pen accommodating portion 20 of the rear mounting case 110.

As shown in FIG. 2, the seating member 120 may include a coupling portion 124 and a perpendicular wall 122, or bracket wall 122. When the seating member 120 is coupled to the rear mounting case 110, the coupling portion 124 may contact the base surface, or receiving surface, of the rear mounting case 110. The perpendicular wall 122 may project upward, somewhat perpendicularly from an end of the coupling portion 124. A side wall 112 may also project upward, somewhat perpendicularly from the base surface of the rear mounting case 110 along a periphery of the rear mounting case 110.

Figure 3A:
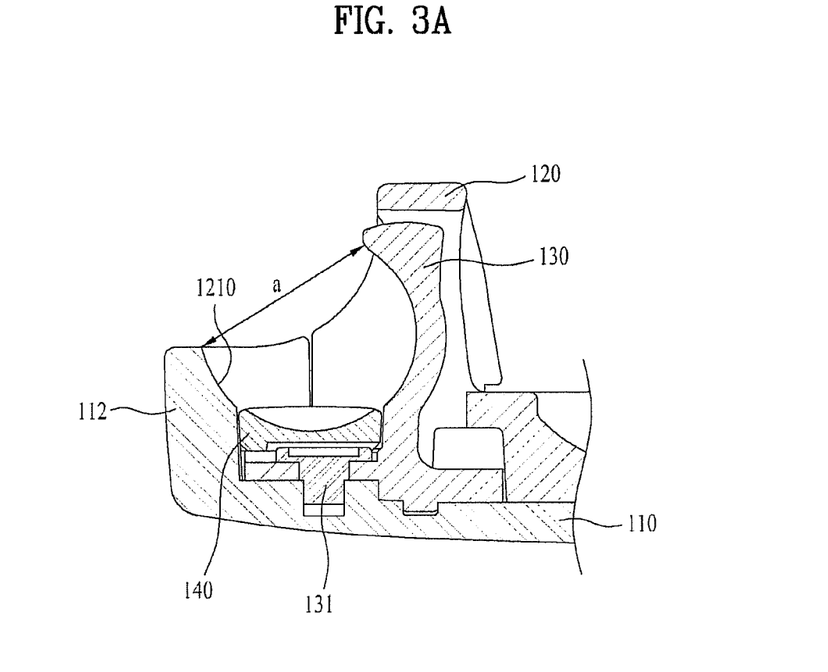
FIGS. 3A and 3B are cross-sectional views of a stylus pen detached from the case shown in FIG. 1, and a stylus pen mounted to the case, respectively.

Once the coupling portion 124 of the seating member 120 is coupled to the base surface of the rear mounting case 110, the perpendicular wall 122 of the seating member 120 may face the side wall 112 of the rear mounting case 110 as shown in FIG. 1. In this arrangement, the perpendicular wall 122 of the seating member 120 and the side wall 112 of the rear mounting case 110, together with the coupling portion 124 of the seating member 120, may define a periphery of the stylus pen accommodating groove 1210 as shown in FIG. 3A. As shown in FIG. 1, the perpendicular wall 122 of the seating member 120 may also serve as a partition wall that distinguishes the mobile terminal accommodating portion 10 from the stylus pen accommodating portion 20.

To stably seat a stylus pen, or other such pointing and/or touching implement, in the stylus pen accommodating groove 1210 stably, an inner peripheral size and shape of the stylus pen accommodating groove 1210 may correspond to the size and shape of an outer peripheral surface of the stylus pen. Specifically, a contour of an inner peripheral surface of the perpendicular wall 122 and an inner peripheral surface of the side wall 112 may correspond to a contour of the outer peripheral surface of the substantially cylindrical-shaped stylus pen.

In an alternative embodiment, instead of the seating member 120 being coupled to the rear mounting case 110 as a separate part to form the stylus pen accommodating groove 1210, a partition wall may project from the base surface of the rear mounting case 110. Such a partition wall may be provided along a predetermined edge portion of the rear mounting case 110 and longitudinally along an end of the edge portion, and may be integrally formed with the rear mounting case 110.

Figure 3B:
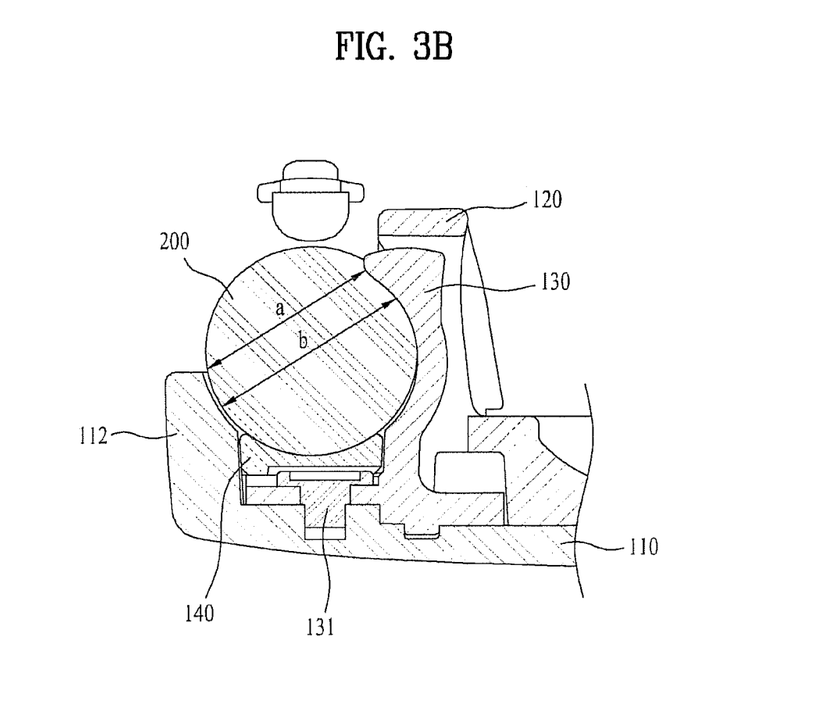

As shown in FIGS. 1 and 3B, the bending hooks 130 may be provided in the stylus pen accommodating groove 1210 and may engage an outer peripheral surface portion of the stylus pen seated in the stylus pen accommodating groove 1210. As shown in FIG. 3A, an inner (engaging) surface of the bending hook 130 may be shaped to correspond to the outer peripheral surface of the stylus pen 200 seated in the stylus pen accommodating groove 1210 to securely engage stylus pen 200 as shown in FIG. 3B.

As shown in FIG. 3A, an inner surface of the bending hook 130 (corresponding to the perpendicular wall 122 of the seating member 120) may face the side wall 112 of the rear mounting case 110. An inner surface of the side wall 112 may also be formed in a shape corresponding to the outer peripheral surface of the stylus pen 200.

As shown in FIG. 3B, a distance (a) between an end of the inner surface of the side wall 112 and an end of the inner surface of the bending hook 130 may be less than a cross-sectional diameter (b) of the stylus pen 200. Accordingly, when the user applies a predetermined force to the stylus pen 200 to push it into the groove 1210, the bending hook 130, which may have a certain amount of elasticity, widens enough to receive the stylus pen 200 therein. When the user applies a predetermined force to the stylus pen 200 to remove it from the groove 1210, the bending hook 130 widens enough to allow the stylus pen 200 to be separated therefrom.

As shown in FIGS. 2 to 3B, each bending hook 130 may be fastened to the base surface of the rear mounting case 110 by a screw 131, or other fastener as appropriate. When the bending hook 130 is coupled along the edge portion of the rear mounting case 110 as shown, the seating member 120 may be coupled to the rear mounting case 110 and overlap the bending hook 130, with the coupling portion 124 of the seating member 120 coupled to the base surface of the rear mounting case 110.

Once the stylus pen accommodating groove 1210 is formed by coupling the seating member 120 to the rear mounting case 110, the bending hook 130 may project slightly outward from the stylus pen accommodating groove 1210 as shown in FIG. 3A to stably secure the stylus pen 200 in the stylus pen accommodating groove 1210 as shown in FIG. 3B.

As mentioned above, the recessed portion of the rear mounting case 110 may form the mobile terminal accommodating portion 10 and the stylus pen accommodating groove 1210 may form the stylus pen accommodating portion 20 together with a corresponding portion of the rear mounting case 110. In other words, a cover for a mobile terminal as embodied and broadly described herein may include the mobile terminal accommodating part 10 and the stylus pen accommodating portion 20. The stylus pen accommodating portion 20 may be formed along the end of the mobile terminal accommodating portion 10. The mobile terminal accommodating portion 10 and the stylus pen accommodating portion 20 may be separated from each other by the partition wall defined by the perpendicular wall 122 of the seating member 120, whether the seating member 120 is a separate part or is integrally formed with the rear mounting case 110. One or more bending hooks 130 may be provided in the stylus pen accommodating portion 20 as mentioned above to detachably secure the stylus pen 200 in the groove 1210.

In a case for a mobile terminal as embodied and broadly described herein, the seating member 120 or the partition wall may partition off the internal space of the case for the mobile terminal into the mobile terminal accommodating portion 10 and the stylus pen accommodating portion 20. Nevertheless, both the mobile terminal accommodating portion 10 and the stylus pen accommodating portion 20 may be formed on the rear mounting case 110 such that a sense of unity may be provided between the mobile terminal coupled to the mobile terminal case and the stylus pen 200 received in the groove 1210. Moreover, as the one or more bending hooks 130 provided in the stylus pen accommodating groove 1210 securely engage the outer surface of the stylus pen 200, the stylus pen 200 may be stably held in the groove 1210. Accordingly, the risks of losing the stylus pen 200 may be lowered and the mobility of the mobile terminal may be enhanced.

According to the embodiment shown in FIGS. 1 and 2, the case for the mobile terminal may further include one or more elastic members 140 provided in the stylus pen accommodating groove 1210. Such an elastic member 140 may be formed of an elastic material such as, for example, rubber, urethane, silicon and the like. As shown in FIG. 2, the elastic member 140 may be attached to the coupling portion 124 of the seating member 120 coupled to the base surface of the rear mounting case 110, overlapping the bending hook 130. In this instance, the elastic member 140 may traverse the bending hook 130.

The elastic member 140 may be positioned in the stylus pen accommodating groove 1210 to prevent noise generated by contact between the stylus pen 200 and the seating member 120 when the stylus pen 200 is seated in the stylus pen accommodating groove 1210. Also, when the elastic member 140 is positioned so as to traverse the bending hook 130, the elastic member 140 may be pressed between the bending hook 130 and the stylus pen 200, so that the coupling between the bending hook 130 and the stylus pen 200 may be further stabilized by the elastic member 140. As a result, the stylus pen 200 may be mounted to the cover for the mobile terminal more stably.

Figure 4:
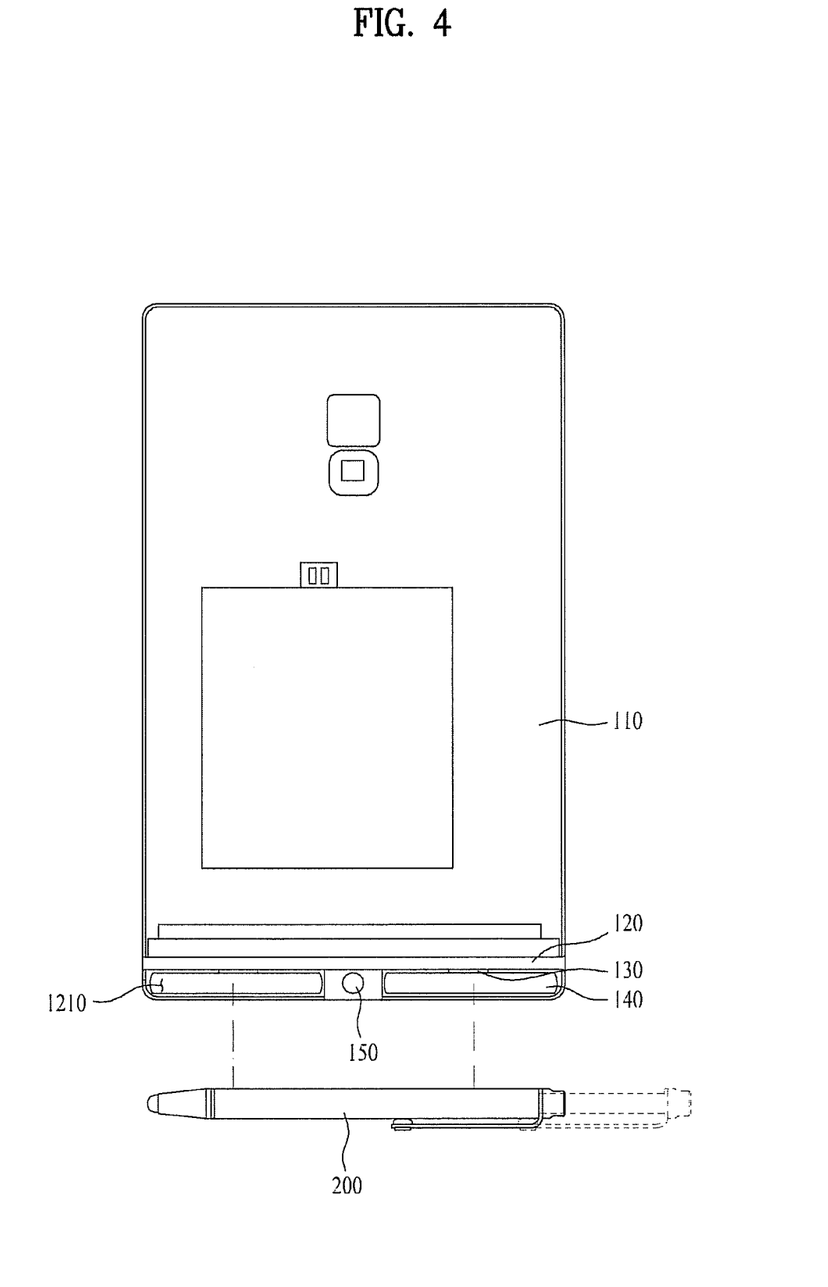
FIG. 4 is a plan view of an exemplary extendible stylus pen provided with a case of the mobile terminal shown in FIG. 1.
Figure 5A:
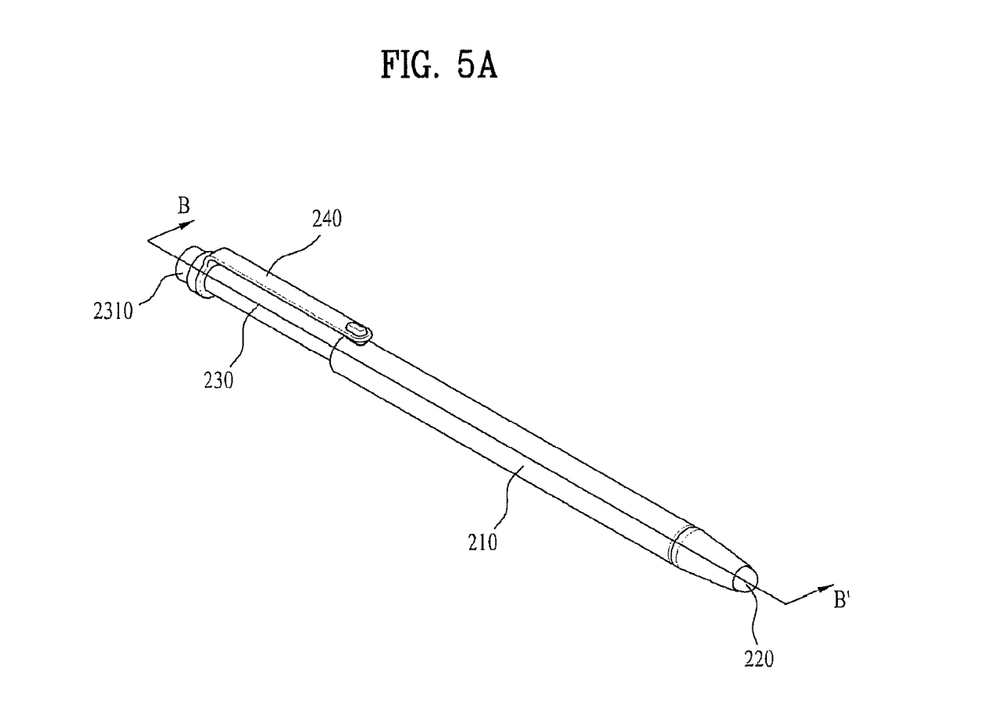
FIG. 5A is a perspective view of the stylus pen shown in FIG. 4.
Figure 5B:
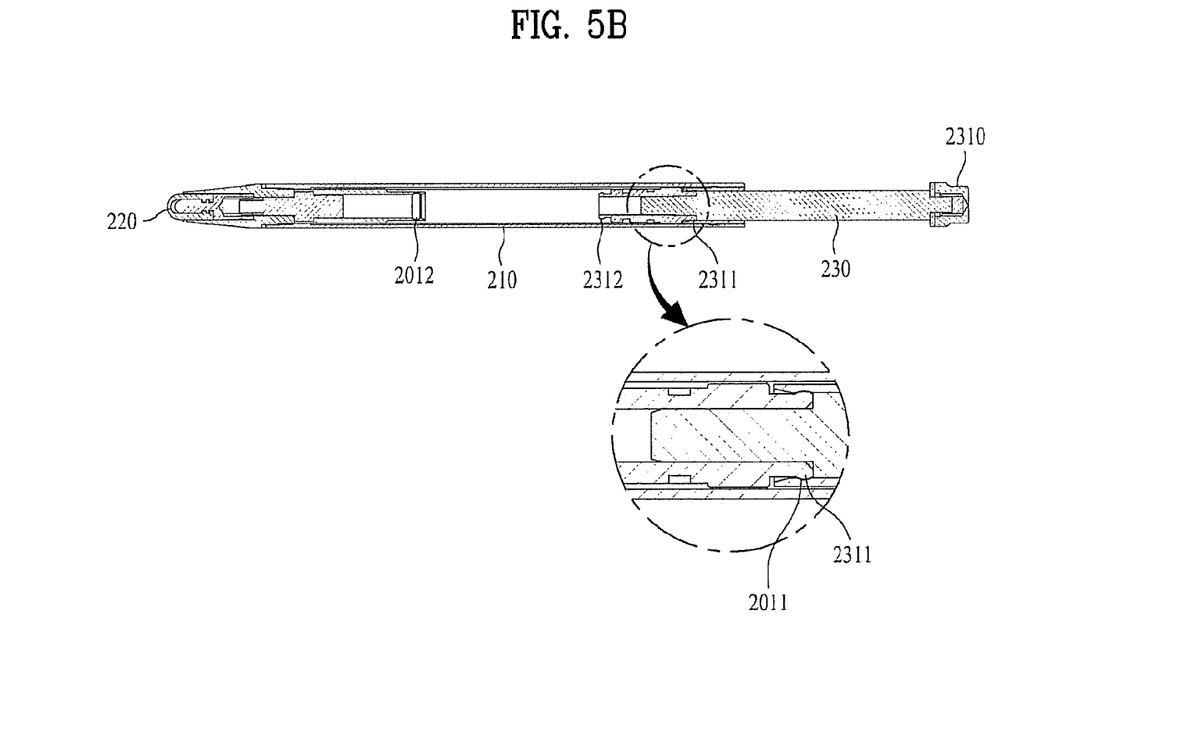
FIGS. 5B and 5C are cross-sectional views of the stylus pen shown in FIG. 4.
Figure 5C:
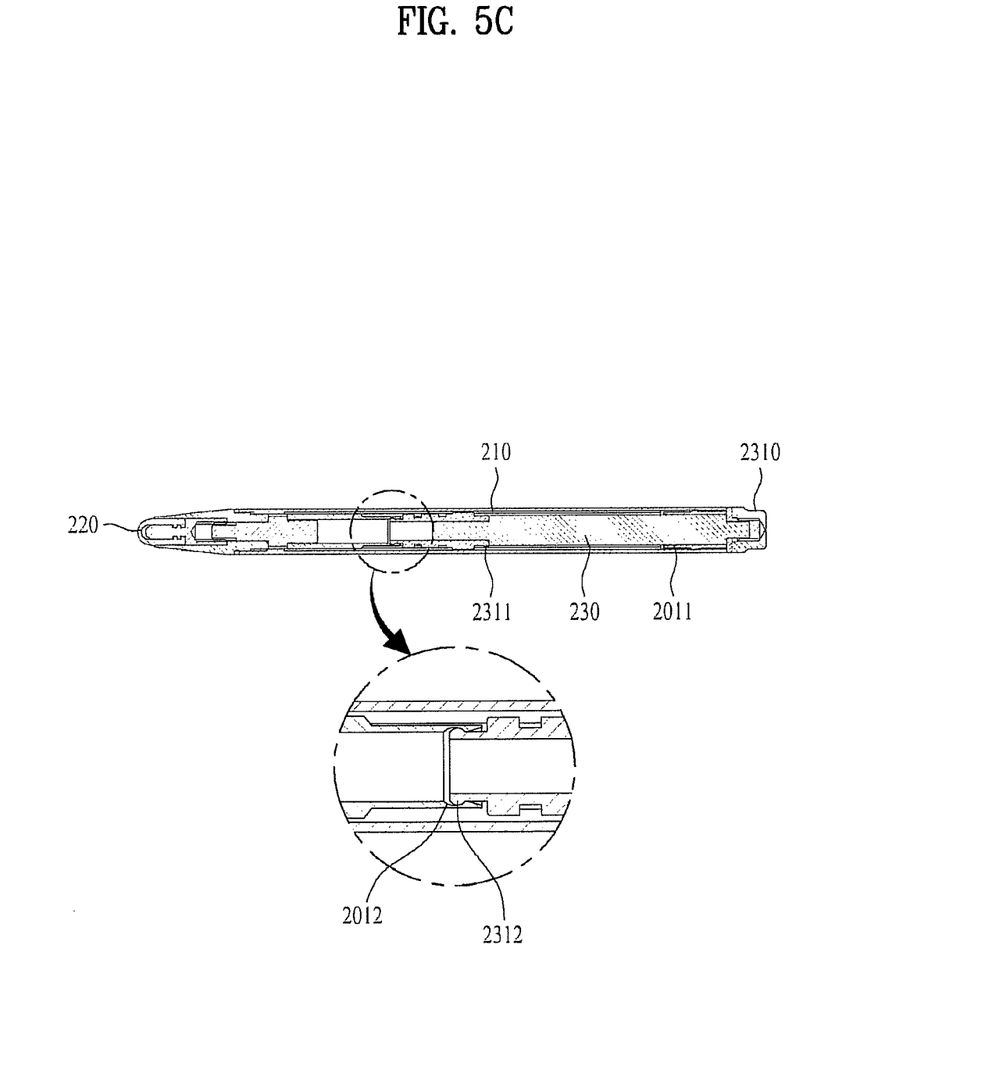

Referring to FIGS. 4 and 5A-5C, a structure of a stylus pen 200 provided in a case for a mobile terminal according to another embodiment will now be described. FIG. 4 shows that the stylus pen 200 may be mounted to a case for a mobile terminal according to this embodiment, FIG. 5A illustrates a structure of the stylus pen 200, and FIGS. 5B and 5C are side sectional views of the stylus pen 200, taken along B-B' line shown in FIG. 5A.

As shown in FIGS. 4 and 5A, the stylus pen 200 may be extendible in a longitudinal direction. According to one embodiment, the extendible stylus pen 200 may be accommodated by the stylus pen accommodating groove 1210 described above, in a retracted state, so that its retracted length corresponds to the length of the stylus pen accommodating groove 1210. As shown in FIG. 4, the stylus pen accommodating groove 1210 may be formed at a lower end of the rear mounting case 110 and may have a predetermined length similar to the length of the lower end of the rear mounting case 110. In this instance, the length of the stylus pen 200 may be adjustable so that the entire stylus pen 200 may be received in the stylus pen accommodating groove 1210. The stylus pen 200 may be separated from the case of the mobile terminal and then extended for use.

Specifically, as shown in FIG. 5A, the extendible stylus pen 200 may include a pipe-shaped body 210, a pen tip 220 and an extendible shaft 230. The body 210 may be inserted in the stylus pen accommodating groove 1210 and hooked to, or engaged by, the bending hook(s) 130. The pen tip 220 may be formed at a first end of the body 210. The extendible shaft 230 may be inserted into and extend out of a second end of the body 210 and may slide in a longitudinal direction with respect to the body 210. As the extendible shaft 230 slides longitudinally with respect to the body 210, the length of the stylus pen 200 may be adjustable. As shown in FIG. 5A, a handle 240 may be provided on the extendible shaft 230 to allow the user to easily push the extendible shaft 230 to extend/retract the stylus pen 200.

According to one embodiment, at least first and second position fixing grooves 2011 and 2012 may be formed in the body 210 of the stylus pen 200. A first position fixing protrusion 2311 and a second position fixing protrusion 2312 may be formed on the extendible shaft 230. The first position fixing groove 2011 and the second position fixing groove 2012 may be spaced apart a predetermined distance from each other, with the first position fixing protrusion 2311 and the second position fixing protrusion 2312 spaced apart the same predetermined distance from each other. The first and second position fixing grooves 2011 and 2012 and the first and second position fixing protrusions 2311 and 2312 are shown in FIGS. 5B and 5C.

As shown in FIG. 5B, when the stylus pen 200 is extended, the first position fixing protrusion 2311 of the extendible shaft 230 may be inserted in the first position fixing groove 2011 of the body 210. The coupling of the first position fixing protrusion 2311 and the first position fixing groove 2011 may provide the user with a tactile response, such as, for example, a clicking when the extendible shaft 230 is pulled to confirm the coupling therebetween. The extendible shaft 230 may be fixed in this extended state with respect to the body 210.

As shown in FIG. 5C, when the stylus pen 200 is contracted, the second position fixing protrusion 2312 of the extendible shaft 230 may be inserted in the second position fixing groove 2012 of the body 210. The coupling of the second position fixing protrusion 2312 with the second position fixing groove 2012 allows the extendible shaft 230 to be fixed in the body 210 and may provide the user with a response such as the clicking described above when the extendible shaft 230 is pulled or pushed.

A structure and another usage example of a case for a mobile terminal in accordance with an embodiment as broadly described herein will now be described in detail with reference to FIGS. 6A and 6B.

Figure 6A:
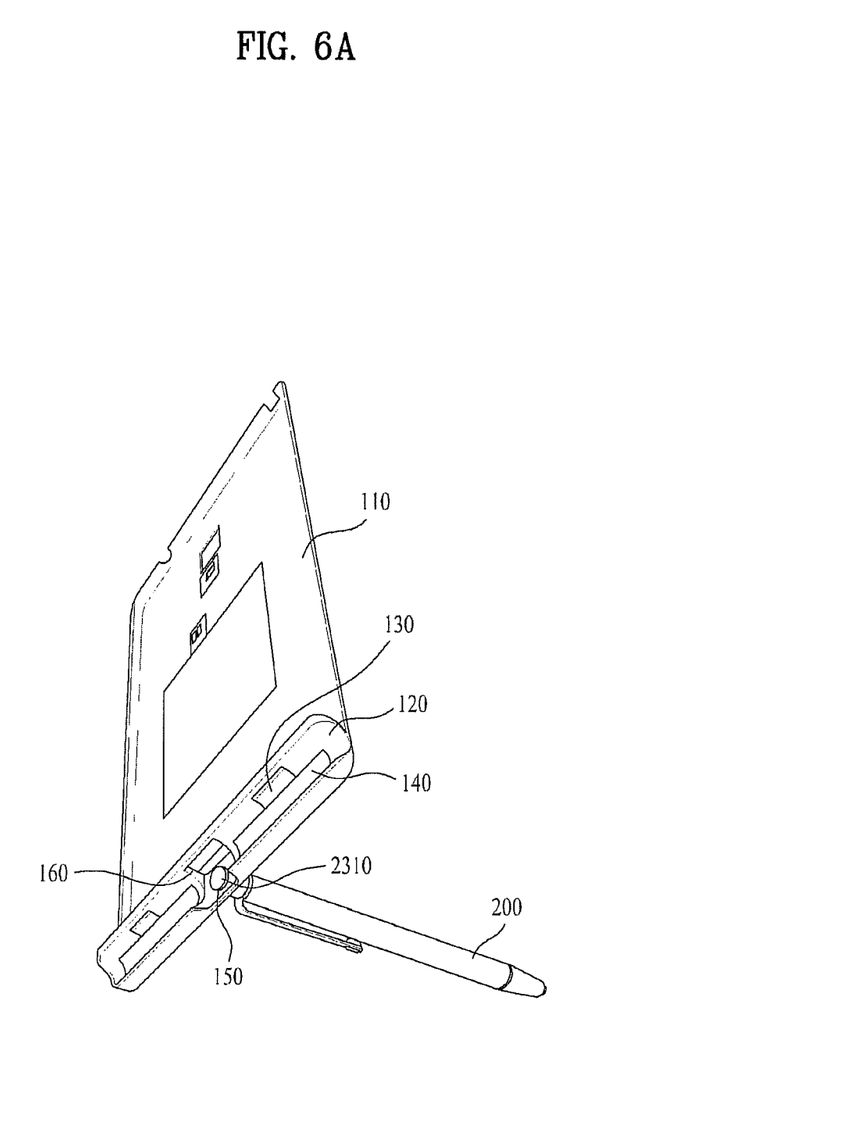
FIG. 6A is a perspective view of a case for the mobile terminal shown in FIG. 1, with a stylus pen coupled thereto.

FIG. 6A illustrates a way in which a rear mounting case 110 provided in a case for a mobile terminal may be supported in an upright position by a stylus pen 200. FIG. 6B illustrates an external connector connected to a mobile terminal 100 having the rear mounting case 110 coupled thereto, with the rear mounting case 110 supported in an upright position by the stylus pen 200. As shown in FIGS. 6A and 6B, the rear mounting case 110 may be supported in an upright position, on, for example, a table top by the stylus pen 200, so that the mobile terminal 100 may be easily usable.

According to one embodiment, the rear mounting case 110 may further include a stationary hole 150 into which a proximal end of the stylus pen 200 (opposite the tip 220) may be inserted. Referring again to FIGS. 1 and 4, such a stationary hole 150 may be formed in a portion of the base surface of the stylus pen accommodating groove 1210. For example, as shown in FIG. 2, the stationary hole 150 may be formed through the rear mounting case 110 and the seating member 120 may have an open portion corresponding to the stationary hole 150 and thus not cover the hole 150 when coupled to the base surface of the rear mounting case 110. The stationary hole 150 may have a predetermined diameter appropriate to receive the proximal end of the stylus pen 200 therein.

When the proximal end of the stylus pen 200 is inserted in the stationary hole 150, the stylus pen 200 may be positioned obliquely with respect to the rear mounting case 110 as shown in FIG. 6A. In this instance, the stylus pen 200 is used to maintain the upright stationary state of the mobile terminal 100.

According to one embodiment, the proximal end of the stylus pen 200 may be forcedly inserted in the stationary hole 150. Thus, a diameter of the end of the stylus pen 200 may be greater than a diameter of the stationary hole 150.

When the end of the stylus pen 200 is forcedly inserted into the stationary hole 150 in this manner, the coupling force between the stylus pen 200 and the stationary hole 150 may be enhanced. Also, insertion of the end of the stylus pen 200 into the stationary hole 150 may provide some type of user feedback, such as the clicking as described above, to confirm coupling therebetween.

According to another embodiment, a stepped portion 2310 having a relatively small diameter may be formed at the end of the stylus pen 200 to be inserted into the stationary hole 150. In this instance, only the stepped portion 2310 may be inserted in the stationary hole 150. In other words, the stepped portion 2310 may have a predetermined shape and diameter to provide for insertion into the stationary hole 150. An end of the extendible shaft 230 adjacent to the stepped portion 2310 may be formed in a shape that precludes insertion into the stationary hole 150. As shown in FIG. 5A, a diameter of the end of the extendible shaft 230 adjacent to the stepped portion 2310 may be larger than the diameter of the stationary hole 150.

When the stepped portion 2310 is formed at the end of the stylus pen 200 according to this embodiment, the end of the stylus pen 200 is inserted in the stationary hole 150 and the position of the stylus pen 200 in the stationary hole 150 may be fixed. Accordingly, the stylus pen 200 may support the rear mounting case 110 more stably.

According to still another embodiment, an external connector hole 160 may be formed in the stylus pen accommodating groove 1210. As shown in FIG. 6A, such an external connector hole 160 may be formed in a side surface of the stylus pen accommodating groove 1210 so that, when the end of the stylus pen 200 is inserted in the stationary hole 150, an edge of the end of the stylus pen 200 may be positioned on the same plane as the base surface of the stylus pen accommodating groove 1210, or positioned outside the base surface of the stylus pen accommodating groove 1210. The side surface of the stylus pen accommodating groove 1210 in which the external connector hole 160 is formed may be positioned along an end of the mobile terminal accommodating portion 10 formed in the rear mounting case 110.

Figure 6B:
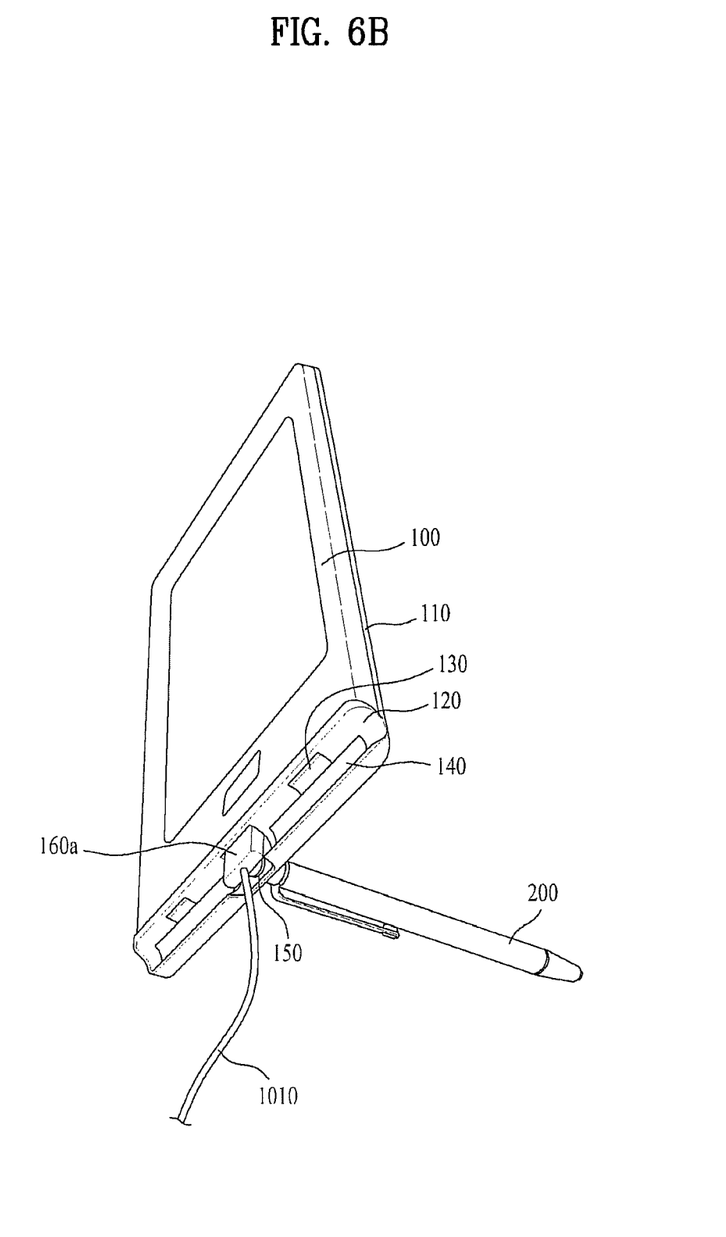
FIG. 6B is a perspective view of the case for the mobile terminal shown in FIG. 1, including an external connector.

In this instance, even when the end of the stylus pen 200 is inserted in the stationary hole 150 as shown in FIG. 6B, an external connector 160a may pass through the external connector hole 160 formed in the side surface of the stylus pen accommodating groove 1210. In this embodiment, the edge of the end of the stylus pen 200 does not project beyond the bottom of the stylus pen accommodating groove 1210. Accordingly, the external connector 160a does not interfere with the rear end of the stylus pen 200 as it passes through the external connector hole 160.

According to this embodiment, as shown in FIG. 6B, an external connector such as a charger may be connected to the mobile terminal 100, while the mobile terminal 100 is supported in the upright position by the rear mounting case 110 and the stylus pen 200. As a result, the mobile terminal 100 may be positioned upright to, for example, watch a video file and to charge the mobile terminal simultaneously. Accordingly, usage of the mobile terminal may be enhanced.

Figure 7:
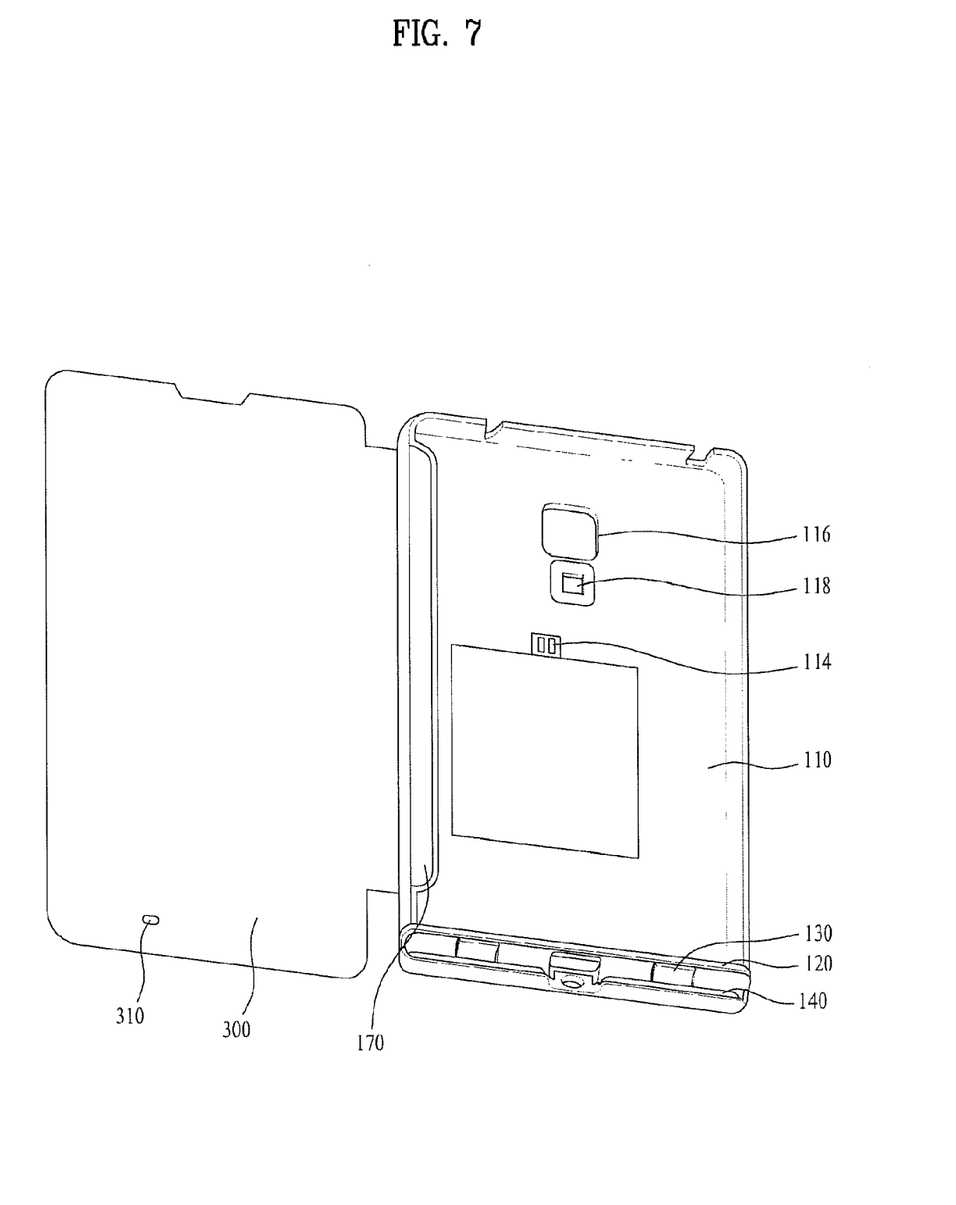
FIG. 7 is a plan view of a front side of a case for a mobile terminal according to another embodiment as broadly described herein.

Referring to FIG. 7, a structure of a case for a mobile terminal according to various embodiments may further include an opening/closing cover 300, or front cover 300. The opening/closing cover 300 may be connected to a side edge of the rear mounting case 110 to cover a front surface of the mobile terminal 100 mounted on the rear mounting case 110. Such an opening/closing cover 300 may cover the front surface of the mobile terminal and protect a touchscreen from external shock and contamination.

According to one embodiment, the opening/closing cover 300 may be formed of a different material than that of the rear mounting case 110. For example, while the rear mounting case 110 may be formed of a solid plastic material to protect a rear surface of the mobile terminal from an external shock, the opening/closing cover 300 may be formed of a soft material, such as leather, so as to avoid damage to a front surface, such as a touchscreen, of the mobile terminal 100.

The opening/closing cover 300 and the rear mounting case 110 may be coupled by a connector 170 that is a separate part as shown in FIG. 7. A first end of the connector 170 may be coupled to a base surface adjacent to an end of the rear mounting case 110 and the opening/closing cover 300 may be coupled to a second end of the connection member 170. Such a connector 170 may allow the opening/closing cover 300 and the rear mounting case 110 formed of different materials to be easily connected with each other.

According to another embodiment, a microphone hole 310 may be formed in the opening/closing cover 300 as shown in FIG. 7. Such a microphone hole 310 may be formed in a predetermined position corresponding to a position of a microphone formed in the front of the mobile terminal 100, so that even when the opening/closing cover 300 covers the mobile terminal, external sounds may be input to the mobile terminal 100 effectively.

According to still another embodiment, as shown in FIG. 7, a near field communication (NFC) antenna 114, a camera hole 116 and a speaker hole 118 may be formed in the base surface of the rear mounting case 110. The camera hole 116 and the speaker hole 118 may be formed corresponding to a camera and a speaker, respectively, of the mobile terminal 100 coupled to the rear mounting case 110. According to this embodiment, the NFC antenna 114 may be provided in the cover to implement near field communication. Even when the rear mounting case 110 is coupled to the mobile terminal 100, the camera of the mobile terminal 100 may be used and the sound output from the mobile terminal 100 may be delivered to the user effectively.

In a mobile terminal, a case for a mobile terminal, and a controlling method thereof, as embodied and broadly described herein, the stylus pen may be mounted to the case coupled to the back surface of the mobile terminal stably. The stylus pen may be stored together with the mobile terminal conveniently. Accordingly, the risks of losing the stylus pen may be reduced. Also, the stylus pen may be mounted to the case for the mobile terminal stably. Accordingly, a sense of unity of the stylus pen embedded in the mobile terminal may be provided, even though the stylus pen is not embedded in the mobile terminal.

It will be apparent to those skilled in the art that the disclosed embodiments and features may include other form(s) without departing from the spirit or scope as broadly described herein.

In addition, the above-described methods may be implemented in a program recorded medium as computer-readable codes. The computer-readable media may include all kinds of recording devices in which data readable by a computer system are stored. The computer-readable media may include ROM, RAM, CD-ROM, magnetic tapes, floppy discs, optical data storage devices, and the like for example and may also include carrier-wave type implementations (e.g., transmission via Internet). The computer may include a control unit of the mobile terminal.

A case for a mobile terminal is provided which has a stable stylus pen mounting structure to provide the sense of unity between the stylus pen and the mobile terminal, while mounting the stylus pen to the mobile terminal stably.

A case for a mobile terminal as embodied and broadly described herein may include a mobile terminal accommodating portion configured to receive a back side of the mobile terminal therein; a stylus pen accommodating portion formed next to an end of the mobile terminal accommodating portion, along the end of the mobile terminal accommodating portion and configured to receive a stylus pen therein; and an opening/closing cover connected to another end of the mobile terminal accommodating portion configured to be folded to cover a front side of the mobile terminal received in the mobile terminal accommodating portion.

A case for a mobile terminal in accordance with another embodiment may include a rear mounting case recessed to be coupled to a back side of a mobile terminal; a seating member coupled to a base surface of the rear mounting case to define a stylus pen accommodating groove; and one or more bending hooks provided in the stylus pen accommodating groove to hook a lateral surface of the stylus pen seated in the stylus pen accommodating groove.

A case for a mobile terminal in accordance with another embodiment may include a mobile terminal accommodating portion recessed to seat a back side of the mobile terminal therein; a stylus pen accommodating portion formed along an end of the mobile terminal accommodating portion in a lower portion of the mobile terminal accommodating portion; a partition wall provided along a boundary portion between the mobile terminal accommodating portion and the stylus pen accommodating portion; and one or more bending hooks provided in the stylus pen accommodating portion to hook a lateral surface of the stylus pen seated in the stylus pen accommodating portion.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A case for a mobile terminal, comprising: a rear mounting case configured to be coupled to a corresponding rear side of a mobile terminal, the rear mounting case having a terminal receiving portion configured to receive the mobile terminal therein and a stylus pen receiving portion provided along a first end of the terminal receiving portion and configured to receive a stylus pen therein; a front cover connected to a second end of the terminal receiving portion to selectively cover at least a front side of the mobile terminal received in the terminal receiving portion; a seating bracket configured to be coupled to the stylus pen receiving portion of the rear mounting case to define a stylus pen groove and to distinguish the terminal receiving portion from the stylus pen receiving portion; and one or more bending hooks provided in the stylus pen groove to engage an outer peripheral surface of the stylus pen received in the stylus pen groove.

2. The case of claim 1, wherein a contour of an inner surface of each of the one or more bending hooks has a shape corresponding to the outer peripheral surface of the stylus pen to be received in the stylus pen receiving portion.

3. The case of claim 2, wherein a contour of an inner surface of the stylus pen receiving portion has a shape corresponding to the outer peripheral surface of the stylus pen received therein.

4. The case of claim 1, further comprising one or more elastic members provided in the stylus pen receiving portion.

5. The case of claim 1, wherein the stylus pen to be received in the stylus pen receiving portion of the rear mounting case is configured to be extendible in a longitudinal direction, and to be contracted in the longitudinal direction to a length corresponding to a longitudinal length of the stylus pen receiving portion so as to be accommodated in the stylus pen receiving portion.

6. The case of claim 5, wherein the stylus pen to be received in the stylus pen receiving portion comprises:
a tubular body configured to be inserted in the stylus pen receiving portion and to be hooked by the one or more bending hooks;
a pen tip formed at a first end of the body; and
an extendible shaft configured to be slidably inserted into and extended out of the body through a second end of the body.

7. The case of claim 6, wherein the stylus pen further comprises:
first and second position fixing grooves formed in one of an inner surface of the body or an outer surface of the extendible shaft; and
first and second position fixing protrusions formed in the other one of the inner surface of the body or the outer surface of the extendible shaft,
wherein the first position fixing protrusion is inserted into the first position fixing groove when the stylus pen is fully extended to fix the extendible shaft in the fully extended position from the second end of the body, and the second position fixing protrusion is inserted into the second position fixing groove when the stylus pen is fully retracted to fix the extendible shaft in a fully retracted position in the body.

8. The case of claim 1, further comprising a stationary hole penetrating the stylus pen receiving portion of the rear mounting case and configured to receive an end of the stylus pen therein.

9. The case of claim 8, wherein the end of the stylus pen is force fit in the stationary hole.

10. The case of claim 8, wherein the stationary hole is configured to receive therein only a stepped portion formed in the end of the stylus pen, wherein a diameter of the stepped portion is less than that of portions of the stylus pen adjacent to the stepped portion.

11. The case of claim 8, further comprising an external connector hole penetrating a side surface of the stylus pen receiving portion, wherein the side surface of the stylus pen receiving portion is positioned along the first end of the mobile terminal receiving portion.

12. The case of claim 11, wherein an outer surface of the end of the stylus pen received in the stationary hole is positioned on substantially the same plane as the stylus pen receiving portion.

13. The case of claim 1, wherein the terminal receiving portion is configured to be directly coupled to a rear case of the mobile terminal to cover an external battery pack received in a back surface of the rear case.

14. The case of claim 1, wherein the seating bracket comprises:
- a coupling portion contacting a receiving surface of the stylus pen receiving portion of the rear mounting case when the seating bracket is coupled to the rear mounting case; and
- a bracket wall that extends outward from the coupling portion,
- wherein a side wall of the rear mounting case extends outward from the receiving surface of the stylus pen receiving portion at an end of the rear mounting case, and
- wherein the side wall of the rear mounting case and the seating bracket together form the stylus pen groove.

15. The case of claim 14, wherein each of the one or more bending hooks is fastened to the receiving surface of the stylus pen receiving portion of the rear mounting case by a screw, and the coupling portion of the seating bracket is attached to the receiving surface of the stylus pen receiving portion of the rear mounting case.

16. The case of claim 1, wherein a material of the front cover is different from a material of the rear mounting case, and wherein the front cover comprises a microphone hole formed at a position corresponding to a position of a microphone provided in the mobile terminal received in the recess of the rear mounting case.

17. The case of claim 1, further comprising a connection bracket having a first end connected to the second end of the terminal receiving portion of the rear mounting case and a second end connected to the front cover.

18. The case of claim 1, further comprising:
- a near field communication (NFC) antenna formed in a receiving surface of at least one of the terminal receiving portion or the stylus pen receiving portion of the rear mounting case; and
- a camera hole and a speaker hole formed in the rear mounting case, at positions respectively corresponding to a camera and a speaker provided in the mobile terminal coupled to the rear mounting case.

19. The case of claim 1, further comprising: a partition wall provided along a boundary between the terminal receiving portion and the stylus pen receiving portion of the rear mounting case.

20. The case of claim 1, wherein the stylus pen receiving portion is provided on one side of the rear mounting case, the one side of the rear mounting case to be adjacent the rear side of the mobile terminal when the mobile terminal is coupled to the rear mounting case, and the seating bracket is to be coupled to the stylus pen receiving portion on the one side of the rear mounting case.

21. A case for a mobile terminal, comprising: a rear mounting case to couple to a side of a mobile terminal, the rear mounting case having: a terminal receiving portion, at a side of the rear mounting case, to receive the mobile terminal therein, and a stylus pen receiving portion, at a first end of the terminal receiving portion, to receive a stylus pen, the stylus pen receiving portion provided at the side of the rear mounting case; a front cover, at a second end of the terminal receiving portion, to be provided over the mobile terminal when the mobile terminal is at the terminal receiving portion; a seating member to couple to the stylus pen receiving portion at the side of the rear mounting case and to define a stylus pen groove, and the seating member to distinguish the terminal receiving portion from the stylus pen receiving portion at the side of the rear mounting case; and one or more bending hooks provided in the stylus pen groove to engage an outer peripheral surface of the stylus pen received in the stylus pen groove.

* * * * *